US010295642B2

(12) United States Patent
Arunachalam

(10) Patent No.: US 10,295,642 B2
(45) Date of Patent: May 21, 2019

(54) CONSTRUCTION OF DIAGNOSTIC IMAGES FROM MRI DATA ACQUIRED IN AN INHOMOGENEOUS POLARIZING MAGNETIC FIELD

(71) Applicant: VOXELGRIDS INNOVATIONS PRIVATE LIMITED, Karnataka (IN)

(72) Inventor: Arjun Arunachalam, Singapore (SG)

(73) Assignee: VOXELGRIDS INNOVATIONS PRIVATE LIMITED, Karnataka (IN)

( * ) Notice: Subject to any disclaimer, the term of this patent is extended or adjusted under 35 U.S.C. 154(b) by 152 days.

(21) Appl. No.: 15/533,217

(22) PCT Filed: Dec. 3, 2015

(86) PCT No.: PCT/SG2015/050486
§ 371 (c)(1),
(2) Date: Jun. 5, 2017

(87) PCT Pub. No.: WO2016/089312
PCT Pub. Date: Jun. 9, 2016

(65) Prior Publication Data
US 2017/0363703 A1 Dec. 21, 2017

(30) Foreign Application Priority Data
Dec. 4, 2014 (SG) .............. 10201408086P

(51) Int. Cl.
*G01V 3/00* (2006.01)
*G01R 33/565* (2006.01)
(Continued)

(52) U.S. Cl.
CPC ..... *G01R 33/56563* (2013.01); *G01R 33/243* (2013.01); *G01R 33/445* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 7,689,015 B2 3/2010 Takai
2010/0085052 A1* 4/2010 Johnson ............. G01R 33/4824
324/309

FOREIGN PATENT DOCUMENTS

WO WO-2012/145197 A1 10/2012

OTHER PUBLICATIONS

Jezzard et al., "Correction for Geometric Distortion in Echo Planar Images from Bo Field Variations", Magnetic Resonance in Medicine, vol. 34, No. 1, Jul. 31, 1995, pp. 65-73.
(Continued)

*Primary Examiner* — Walter L Lindsay, Jr.
*Assistant Examiner* — Frederick Wenderoth
(74) *Attorney, Agent, or Firm* — Marshall, Gerstein & Borun LLP

(57) ABSTRACT

According to one aspect of the invention, there is provided a method of constructing a diagnostic image of a sample from MRI data acquired while subjecting the sample to an inhomogeneous polarizing magnetic field, the method comprising the steps of: i) deriving an estimate of the spatial map of the inhomogeneous polarizing magnetic field; ii) acquiring the MRI data; iii) processing the estimate of the spatial map with the acquired MRI data to obtain an estimate of the diagnostic image; iv) calculating an acquired data error in response to the estimates of the spatial map and the diagnostic image; v) updating the estimate of the spatial map in response to the calculated error; and repeating the steps iii) to v) to improve the estimate of the spatial map of the earlier iteration and the estimate of the diagnostic image, wherein
(Continued)

the repetition is stopped when the calculated error of the latest iteration reaches within a tolerance range and wherein the estimate of the diagnostic image from the latest iteration becomes the diagnostic image of the sample.

12 Claims, 4 Drawing Sheets

(51) Int. Cl.
    *G01R 33/24*          (2006.01)
    *G01R 33/44*          (2006.01)

(58) Field of Classification Search
    USPC .......................................................... 324/309
    See application file for complete search history.

(56) References Cited

OTHER PUBLICATIONS

Irarrazabal et al., "Inhomogeneity Correction Using an Estimated Linear Field Map", Magnetic Resonance in Medicine, vol. 35, No. 2, Feb. 28, 1996, pp. 278-282.

Fessler et al., "Toeplitz-Based Iterative Image Reconstruction for MRI With Correction for Magnetic Field Inhomogeneity", IEEE Transactions on Signal Processing, vol. 53, No. 9, Aug. 15, 2005, pp. 3393-3402.

Zeng et al., "Image Distortion Correction in EPI: Comparison of Field Mapping With Point Spread Function Mapping", Magnetic Resonance in Medicine, vol. 48, No. 1, Jun. 27, 2002, pp. 137-146.

De Zanche et al., "NMR Probes for Measuring Magnetic Fields and Field Dynamics in MR Systems", Magnetic Resonance in Medicine, vol. 60, No. 1, Jun. 25, 2008, pp. 176-186.

Wang et al., "Geometric Distortion in Structural Magnetic Resonance Imaging", Current Medical Imaging Reviews, vol. 1, No. 1, Jan. 1, 2005, pp. 49-60.

International Preliminary Report on Patentability in International Application No. PCT/SG2015/050486 dated Feb. 23, 2017, 21 pages.

Search Report and Written Opinion in International Application No. PCT/SG2015/050486 dated Jan. 27, 2016, 7 pages.

Sutton et al., "Fast, Iterative Image Reconstruction for MRI in the presence of Field Inhomogeneities", IEEE Transactions on Medical Imaging, vol. 22, No. 2, Feb. 1, 2003, pp. 178-188.

\* cited by examiner

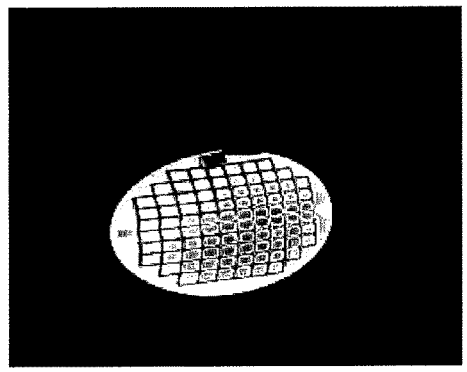 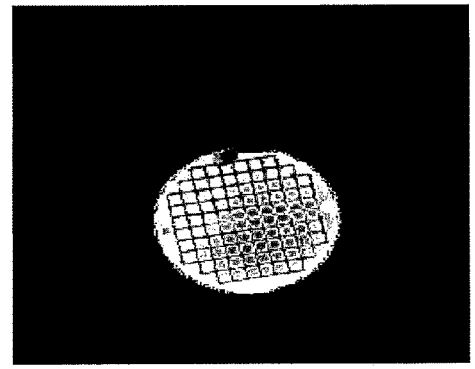
Figure 5A                                Figure 5B
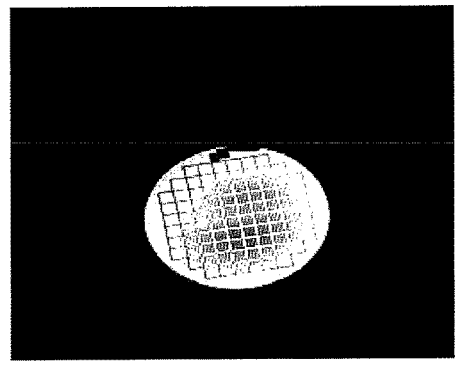 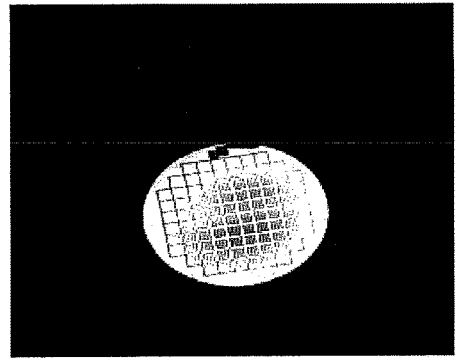
Figure 6A                                Figure 6B

CONSTRUCTION OF DIAGNOSTIC IMAGES FROM MRI DATA ACQUIRED IN AN INHOMOGENEOUS POLARIZING MAGNETIC FIELD

FIELD OF INVENTION

This invention relates to the field of Magnetic Resonance Imaging (MRI). The disclosed invention in particular describes methods and systems that enable the acquisition and reconstruction of diagnostic quality MRI images in the presence of a highly inhomogeneous static magnetic field generated by the main MRI magnet.

BACKGROUND

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be sampled and processed to form an image.

When utilizing these "MR (magnetic resonance)" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in 'Edelstein W A, Hutchison J M S, Johnson G, Redpath T. K-space substitution: Spin-Warp MR Imaging and Applications to Human Whole-Body Imaging. Physics in Medicine and Biology 1980; 25:751-756'. The method, referred to as spin-warp imaging, employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

The role of the polarizing field $B_0$ in the entire MR imaging process is indispensable as it influences the intrinsic signal to noise ratio (SNR) in the processed MR images. In an ideal scenario, the $B_0$ field is identical at all spatial location within an imaging volume. A uniform $B_0$ field optimizes SNR throughout the imaging volume, enables high resolution imaging, and facilitates specialized applications such as Magnetic Resonance Spectroscopy. However, while providing a uniform $B_0$ field, the magnet sub-system of an MRI scanner introduces its own set of trade-offs into the overall MRI scanner design. Firstly, a uniform $B_0$ field requires a bulky and expensive MRI magnet that typically requires a specialized room for its installation. Secondly, the structure of the magnet cannot be altered in any substantial manner due to the restriction placed on it by the uniformity specification of the $B_0$ field. If the uniformity of $B_0$ is degraded to address these concerns, the magnetic field gradient amplitudes have to be increased to preserve high resolution imaging capabilities.

MRI systems and methods for imaging in inhomogeneous fields have been proposed before. For example, in U.S. Pat. No. 5,304,930, a device entitled "Remotely Positioned MRI System" was described, which is an example of an MRI device which has a non-homogeneous static magnetic field. Another example of an MRI system designed to generate a non-homogeneous magnetic field has been described in EP 0 887 655 B1. In both these examples, the objective was to alter the design of the magnet itself to improve access to the patient during imaging. In contrast, in high field MRI scanner with homogeneous fields, the size of the opening for patient access to the magnetic field in these devices is generally restricted in size. This limited access results from the fact that producing a high degree of field homogeneity places inherent restrictions on the structural dimension of an MRI magnet.

The approach in the two cited references was more focused on altering the structure of the magnet itself to obtain great flexibility in design at the expense of homogeneity. This approach while addressing the restrictive effects of the magnet structure cannot compensate for the resultant field inhomogeneity, which degrades image quality. Alternatively, reconstruction algorithms [1] have been proposed to compensate for the effects magnetic field inhomogeneity in what are otherwise homogeneous fields set up by cylindrical magnets. But these algorithms are designed to primarily address the issue of susceptibility induced artifacts that cause distortions in air/tissue interfaces. These algorithms cannot facilitate any changes in the restrictive structure of the MRI magnet itself.

Another approach [20] discloses techniques to correct geometric distortion seen in MR images obtained from employing pulse sequences that are sensitive to even mild (less than 5 ppm) magnetic field inhomogeneity that are generated by current, state of the art MRI magnets. The correction techniques discussed therein require that even this mild level of inhomogeneity be accurately modeled.

Therefore, the present invention seeks to address the above shortcomings experienced for MR imaging, especially for those captured in a highly inhomogeneous field. The present invention is capable of compensating for both mild (such as those discussed in [20]) and significant (greater than 10 ppm) levels of field inhomogeneity regardless of the type of pulse sequence that is employed.

SUMMARY

According to one aspect of the invention, there is provided a method of constructing a diagnostic image of a sample from MRI data acquired while subjecting the sample to an inhomogeneous polarizing magnetic field, the method comprising the steps of: i) deriving an estimate of the spatial map of the inhomogeneous polarizing magnetic field; ii) acquiring the MRI data; iii) processing the estimate of the spatial map with the acquired MRI data to obtain an estimate of the diagnostic image; iv) calculating an acquired data error in response to the estimates of the spatial map and the diagnostic image; v) updating the estimate of the spatial map in response to the calculated error; and repeating the steps iii) to v) to improve the estimate of the spatial map of the earlier iteration and the estimate of the diagnostic image, wherein the repetition is stopped when the calculated error of the latest iteration reaches within a tolerance range and wherein the estimate of the diagnostic image from the latest iteration becomes the diagnostic image of the sample.

According to another aspect of the invention, there is provided an MRI data processing server for constructing a diagnostic image of a sample from MRI data acquired while subjecting the sample to an inhomogeneous polarizing magnetic field, the data processing server comprising: at least one processor; and at least one memory including computer program code; the at least one memory and the computer program code configured to, with the at least one processor, cause the server at least to: i) derive an estimate of the spatial map of the inhomogeneous polarizing magnetic field; ii) process the estimate of the spatial map with the acquired MRI data to obtain an estimate of the diagnostic image; iii) calculate an acquired data error in response to the estimates of the spatial map and the diagnostic image; iv) update the estimate of the spatial map in response to the calculated error; and repeat ii) to iv) to improve the estimate of the spatial map of the earlier iteration and the estimate of the diagnostic image, wherein the repetition is stopped when the calculated error of the latest iteration reaches within a tolerance range and wherein the estimate of the diagnostic image from the latest iteration becomes the diagnostic image of the sample.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which:

FIG. 5A shows an image, before correction, of a grid phantom acquired of a magnetic field at 160 ppm homogeneity.

FIG. 5B shows the same image of FIG. 5A, after undergoing correction in accordance with the method of FIG. 1.

FIG. 6A shows an image, before correction, of a grid phantom acquired of a magnetic field at 30 ppm homogeneity.

FIG. 6B shows the same image of FIG. 6A, after undergoing correction in accordance with the method of FIG. 1.

DETAILED DESCRIPTION

Figure 1:
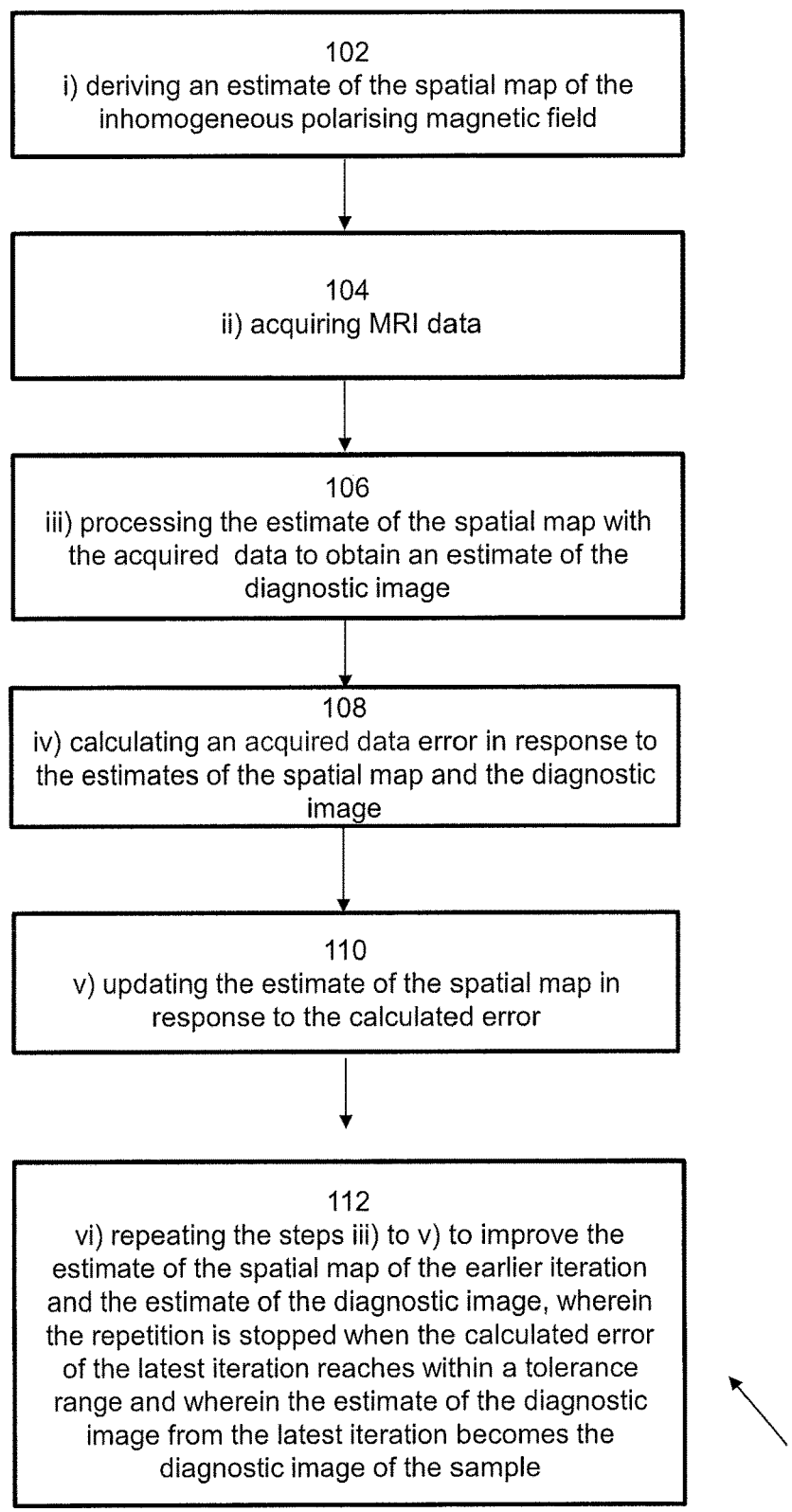
FIG. 1 shows steps of a method, in accordance with one implementation of the present invention, to construct a diagnostic image of a sample from MRI data acquired.

In the following description, various embodiments are described with reference to the drawings, where like reference characters generally refer to the same parts throughout the different views.

FIG. 1 shows steps of a method 100 in accordance with one implementation of the present invention. While conventional MR imaging in an inhomogeneous polarizing magnetic field is known to produce distorted images which will not assist a clinician to make informed medical decisions, the method 100 of FIG. 1 allows for MR imaging that generates images of diagnostic quality in the presence of a highly inhomogeneous polarizing magnetic $B_0$ field. The diagnostic images that the method 100 creates are of sufficient quality that allows information from a sample being imaged to be obtained, for example discernable details of the anatomy of the sample that allows conclusions to be made.

The method 100 constructs a diagnostic image of a sample from MRI data acquired while subjecting the sample to an inhomogeneous polarizing magnetic field through the use of steps 102, 104, 106, 108 and 110 as described below.

In step 102, an estimate of the spatial map of the inhomogeneous polarizing magnetic field is derived. That is, an estimate of the inhomogeneous polarizing magnetic field $B_0$, at the spatial locations where the sample that is to be imaged (interchangeably referred to as "imaging sample"), is obtained. This estimate of the inhomogeneous polarizing magnetic $B_0$ field may be obtained through a field mapping process that employs a magnetic field camera. When such a field mapping process is performed, the estimate of the spatial map may be derived with the sample absent from the inhomogeneous polarizing magnetic field. Alternatively, this spatial map of the inhomogeneous polarizing magnetic $B_0$ field may be obtained using an imaging process that employs an imaging phantom (plastic structure containing water), such as a homogeneous phantom. The purpose of the homogeneous phantom is to provide a control sample, since the perturbations caused by this control sample can be estimated precisely. Such control samples are used in all state of the art MRI scanners for calibrating MRI magnets. In one embodiment, the homogeneous phantom is realized using a plastic structure that only contains water. In another embodiment, the phantom may be another plastic structure with an intricate shape that contains water, where this intricate shape is used to simulate fine detail. This map of the $B_0$ field serves as an initial estimate, to initiate the process of estimating a final accurate image of the sample that is to be imaged. The perturbation of the inhomogeneous polarizing magnetic field $B_0$ that is caused by the imaging sample typically results in the actual $B_0$ field map deviating from this initial estimate. This difference is compensated for in the subsequent steps of the method 100.

Importantly, the method 100 can output images of diagnostic quality despite the Imaging process employing a highly inhomogeneous magnetic $B_0$. From a hardware perspective, this enables a relaxation in the design requirements for the polarizing magnets that are used in tandem with the method 100, when compared to polarizing magnets that are required to create a relatively uniform $B_0$ field for conventional MRI. Accordingly, an alteration of the structure of an MRI scanner is enabled, where the magnets employed can now be lightweight, compact and inexpensive.

In step 104, the MRI data is acquired, such as in k-space. K-space is the Fourier transform of acquired MRI data. Complex values are sampled during the acquiring of the MRI data under a controlled sequence of RF (radiofrequency) and gradient pulses (described later with reference to FIG. 4). The k-space data acquired is that of the sample that has been subjected to the inhomogeneous polarizing $B_0$ field. The k-space data may be acquired at one or more time intervals, such as from collecting multiple sets of the k-space data at one or more echo times. While this k-space data may be used to create images of the sample, such images will be geometrically distorted due to the inhomogeneity of the $B_0$ field in which the k-space data was acquired. Therefore images constructed from the k-space data acquired in step 104 are not of diagnostic image quality. The acquired k-space data has to be further processed for it to be usable to obtain images of diagnostic quality. This processing is described below with reference to steps 106, 108, 110 and 112.

In step 106, an initial estimate of a diagnostic image of the sample is obtained by using the acquired k-space data of step 104 and the estimate of the spatial map from step 102. This initial estimate of the image is subsequently updated through several iterations which leads to the final diagnostic image of the sample. In one implementation, the processing of step 106 involves using the acquired k-space data along with the estimate of the spatial map to construct an imaging plane and/or volume.

In step 108, the estimated spatial map and diagnostic image are used to obtain a k-space dataset. Next, the difference between this k-space dataset and the acquired k-space data is computed to estimate the error in k-space. In this manner, an acquired data error is obtained in response to the estimates of the spatial map and the diagnostic image.

In step 110, the estimate of the spatial map of step 102 is updated in response to the acquired data error of step 108, i.e. the computed error in k-space.

Step 112 then repeats the steps 106, 108 and 110 to employ the updated estimate of the spatial map from the earlier iteration with the acquired k-space data to obtain a new estimate the diagnostic image. This repetition of steps 106, 108 and 110 is stopped when the calculated error in the $B_0$ map from the latest iteration reaches within a tolerance range. The estimate of the diagnostic image from the latest iteration then becomes the final diagnostic image of the sample.

The steps 106, 108 and 110, are repeatedly executed to improve on the initial inhomogeneous polarizing magnetic field $B_0$ estimate of step 102. This is necessary as the imaging sample always perturbs the $B_0$ field in which it is placed in a manner that is unknown apriori. Each iteration of steps 106. 108 and 110 improves the estimate of the initial map of the $B_0$ field by estimating the perturbation caused by the imaging sample and consequently improves the spatial map of the $B_0$ field. This in turn results in an incremental correction of the geometrically distorted diagnostic image after each iteration. In this manner, the diagnostic image that is formed in step 106, after an iteration, is a more accurate reconstruction of the acquired MRI data of step 104.

The iterative application of steps 106, 108 and 110 facilitates the production of MR images with diagnostic quality, despite the use of an inhomogeneous polarizing magnetic $B_0$ field. Stringent hardware requirements that have to be observed when designing magnets that can create homogeneous magnetic fields can therefore be relaxed, since this relaxation is compensated in software with the iterative application of steps 106, 108 and 110. The degree of simplicity of the polarizing magnets that can be used in conjunction with the method 100 then becomes a function of the level of the inhomogeneity that the method 100 can support from the iterative process of steps iii) to v). The method 100 thus allows for the simplification of MRI magnets, for instance from large, bulky magnets that are used to create a homogeneous polarizing magnetic field to lightweight, compact magnets that create an inhomogeneous polarizing magnetic field. This can be achieved without any compromise in image quality whatsoever because method 100 can compensate for the effects of the inhomogeneous field that such simplified MRI magnets may produce.

The method 100 of FIG. 1 is described in more detail with reference to FIG. 2 and Equations [1] to [10] listed below.

Figure 2:
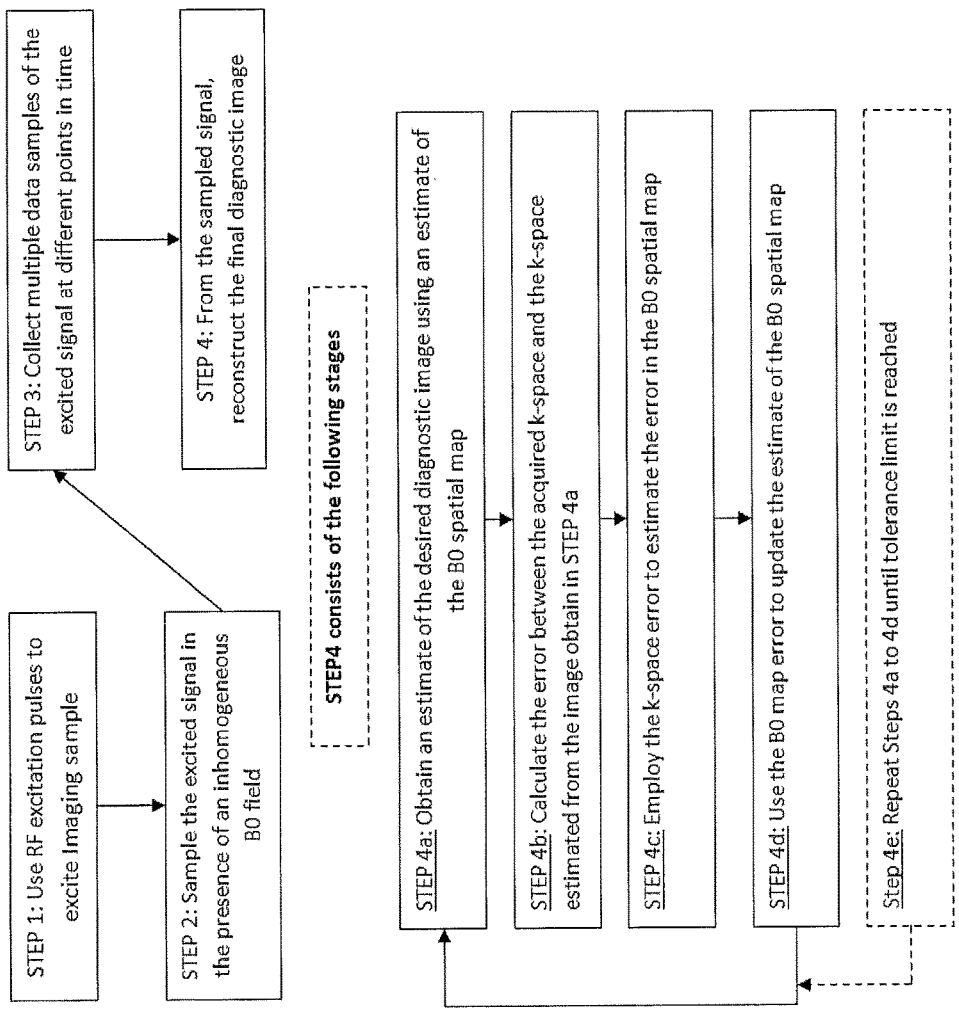
FIG. 2 shows more detail of the method shown in FIG. 1.

In step 1 of FIG. 2, RF pulses are used to excite a sample to be imaged. In step 2, the RF pulses emitted from the excited sample are sampled in the presence of an inhomogeneous polarizing magnetic field. In step 3, multiple samples of the RF pulses emitted from the excited sample are collected at different points of time. The signal acquired at step 3 can generally be expressed as:

$$S(t)=\iint C_1(\vec{r})O(\vec{r})e^{-i\gamma 2\pi B_0(r)(t+TE)}e^{-ikr}dr \quad [1]$$

Here, $B_0$ is the inhomogeneous polarizing magnetic field, r is the spatial coordinate, TE is the echo time, t is the readout duration, k is the spatial harmonic determined by field gradients, $\gamma$ is the gyromagnetic ratio, Cl(r) is the coil sensitivity profile of the Ith receiver, O(r) is the slice of interest. While the RF signals emitted from the excited sample undergo intrinsic signal decay due to tissue related T1 and T2 parameters, these effects have been ignored in Equation [1] for simplicity. Equation [1] denotes the data acquired at one echo time TE but data can also be acquired for multiple such echo times for the purposes of reconstruction of a diagnostic image.

From Equation [1], the following entries of the signal encoding matrix are obtained:

$$E_{(l,k),\rho}=e^{-i\omega(r_\rho)(t_k+TE)}e^{-ik_k r_\rho}C_1(r_\rho) \quad [2]$$

Here, tk is the time-point at which the kth sample in k-space is acquired, $r_\rho$ denotes the voxel spatial coordinate, and $\omega(r_\rho)=\gamma 2\pi B0(r_\rho)$. Therefore, the resultant signal acquisition denoted by Equation [1] is given in Matrix vector formulation by:

$$Ev=d \quad [3]$$

Here, E is the encoding matrix from Equation [2], v is the desired image vector and d is the data acquired at one or more TE echo times. Equation [3] is part of step 4 of FIG. 2 as follows.

In step 4, voxels that are located at unique spatial locations in the imaging volume are resolved from an estimate of a spatial map of the $B_0$ field. Step 4 has several sub-steps: 4a), 4b), 4c), 4d) and 4e). Step 4a) is analogous to step 106 of FIG. 1, so that during the first iteration alone, step 4a) sees an initial estimate of the diagnostic image being obtained using the estimate of the spatial map of the $B_0$ field. By applying an inverse of the matrix E to Equation [3], Equation [3] can be solved to obtain v, which provides the initial estimate of the diagnostic image of step 106 of FIG. 1. In the subsequent iterations, solving Equation [3] in step 4*a* will output improved estimates of the diagnostic image. In solving Equation [3], an algorithm which uses a mathematic approximation function, such as one based on a Taylor series, may be used, as detailed below.

In order to solve Equation [3], an accurate estimate of the $B_0$ field is required given $B_0$ field perturbation caused by the sample to be imaged. Since what is available initially is only a $B_0$ estimate obtained through phantom imaging or via the use of a field camera, Equation [3] can be rewritten as the following:

$$E_{(l,k),\rho} = e^{-i[\hat{\omega}(r_\rho) + \Delta\hat{\omega}(r_\rho)](t_k + TE)} e^{-ik_k r_\rho} C_1(r_\rho) \quad [4]$$

Here, $\hat{\omega}(r_\rho)$ is the initial estimate of the resonant frequency at a particular voxel spatial coordinate. The error in the resonant frequency, caused by $B_0$ field estimation error, at a particular location is denoted by $\Delta\omega(r_\rho)$. The primary source of this error is the perturbation caused by the imaging sample. In order to compensate for this perturbation, the term $e^{-i[\Delta\omega(r_\rho)](t_k + TE)}$ in Equation [4] is approximated as $[1 - i\Delta\omega(r_\rho)(t_k + TE)]$ by using a Taylor series expansion and replaced in Equation [4]. The resultant entries of the encoding matrix in Equation [4] are:

$$E_{(l,k),\rho} = e^{-i\hat{\omega}(r_\rho)(t_k + TE)} e^{-ik_k r_\rho} C_1(r_\rho)(t_k + TE) e^{-i\hat{\omega}(r_\rho)(t_k + TE)} e^{-ik_k r_\rho} C_1(r_\rho) \quad [5]$$

Equation [5] is further written in a succinct form as the following:

$$E_{(l,k),\rho} = \hat{E}_{(l,k),\rho} - i\Delta\omega(r_\rho)(t_k + TE)\hat{E}_{(l,k),\rho} \quad [6]$$

Here, the entries of $\hat{E}_{(l,k),\rho}$ are given by $e^{-i[\hat{\omega}(r_\rho) + \Delta\hat{\omega}(r_\rho)](t_k + TE)} e^{-ik_k r_\rho} C_1(r_\rho)$.

Similarly, the desired image vector v is equivalent to $\hat{V} + \Delta V$ where $\hat{V}$ is the initial estimate of v obtained after solving Equation [3] by using the initial estimate of the field map, i.e. $\hat{V}$ provides the initial estimate of the diagnostic image of step 106 of FIG. 1.

The error in the estimate is given by $\Delta V$ and this value has to be iteratively minimized by successively improving on the field map estimate, as described above with reference to steps 112 of FIG. 1. Therefore, the entries in Equation [3] are re-written as the following:

$$\sum_{r_\rho} \left[ \hat{E}_{(l,k),\rho} - i\Delta\omega(r_\rho)(t_k + TE_n)\hat{E}_{(l,k),\rho} \right] \left[ \hat{V}(r_\rho) + \Delta V(r_\rho) \right] = d_k \quad [7]$$

Now, consider the following equation:

$$\sum_{r_\rho} \hat{E}_{(l,k),\rho} \hat{V}(r_\rho) = \hat{d}_k \quad [8]$$

Here, $d_k$ denotes one acquired k-space data sample and $\hat{d}_k$ is an estimate of this acquired sample obtained after using the estimated $B_0$ map and the computed estimate of the diagnostic image.

Equations [7] and [8] lead to steps 4*b* and 4*c* of FIG. 2. In the right hand side of Equation [9], the k-space error specified in step 4*b* of FIG. 2 is computed. In step 4*c* of FIG. 2, the error in the initial estimate of the diagnostic image as well as the error $\Delta\omega(r_\rho)$, is calculated. Thus, step 4*c* of FIG. 2 is analogous to step 108 of FIG. 1. This calculation is performed as follows.

Using Equation [8] in Equation [7], the following is obtained:

$$\sum_{r_\rho} \Delta V(r_\rho) \hat{E}_{(l,k),\rho} + \Delta\omega(r_\rho) \left[ -i(t_k + TE_n) \hat{V}(r_\rho) \hat{E}_{(l,k),\rho} \right] = d_k - \hat{d}_k \quad [9]$$

In matrix vector formulation, Equation [9] can be re-written as:

$$\left( \hat{E} - i[\text{diag}(t + TE_n) \hat{E} \, \text{diag}(\hat{V})] \right) \begin{pmatrix} \Delta V \\ \Delta\omega \end{pmatrix} = d - \hat{d} \quad [10]$$

Equation [10] can now be solved to obtain the error estimate $\Delta\omega$, which can be used to update the field map. Equation [10] maps to step 4*c* in FIG. 2.

In step 4*c* of FIG. 2, this calculated error $\Delta\omega$ is used to update the spatial map estimate of the $B_0$ field, i.e. step 4*c* of FIG. 2 is analogous to step 110 of FIG. 1.

Step 4*e*) of FIG. 2 sees steps 4*a* to 4*d* being repeated. That is, Equations [3] to [10] will be reiterated, with Equation [3] using the updated field map, rather than the initial $B_0$ field estimate. Accordingly, step 4*e*) of FIG. 2 is analogous to step 112 of FIG. 1.

Figure 3:
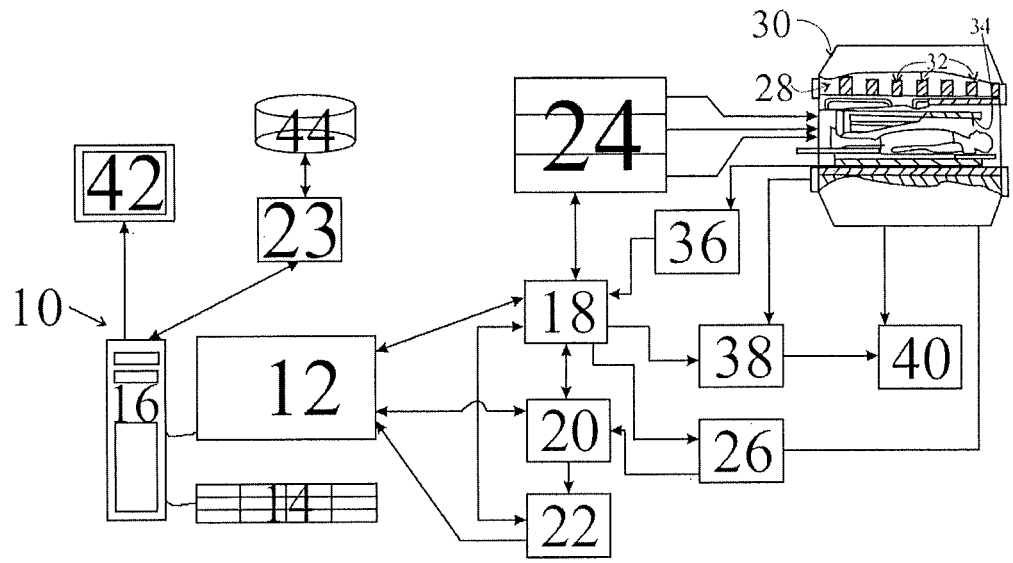
FIG. 3 shows a MRI system in which the method of FIGS. 1 and 2 can be implemented.

An MRI system in which the method of FIGS. 1 and 2 can be implemented is shown in FIG. 3.

The system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34. The polarizing magnet 32 generates the inhomogeneous polarizing magnetic field under which the sample to be imaged is placed. As mentioned in step 102 of FIG. 1, a spatial map of this inhomogeneous polarizing magnetic field is obtained. The RF excitation pulses are applied to the RF coil 34 by the RF system 26 to perform the prescribed magnetic resonance pulse sequence. Responsive MR signals detected by the RF coil 34 or a separate local coil (not shown in FIG. 3) are received by the RF system 26, amplified, demodulated, filtered, and digitized under direction of commands produced by the pulse sequence server 18, which leads to the MRI data acquired in step 104 of FIG. 1. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The RF excitation pulses may be applied to the whole body RF coil 34 or to one or more local coils or coil arrays (not shown in FIG. 3).The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},\qquad [11]$$

and the phase of the received MR signal may also be determined:

$$\varphi=\tan^{-1}Q/I. \qquad [12]$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, Parallel Imaging [19] reconstruction of under-sampled k-space data and the like.

The data processing server 22 has at least one processor; and at least one memory including computer program code. The at least one memory and the computer program code are configured to, with the at least one processor, cause the data processing server 22 at least to: i) derive an estimate of the spatial map of the inhomogeneous polarizing magnetic field; ii) process the estimate of the spatial map with the acquired MRI data to obtain an estimate of the diagnostic image; iii) calculate an acquired data error in response to the estimates of the spatial map and the diagnostic image; and iv) update the estimate of the spatial map in response to the calculated error. The MRI data of step ii) may be acquired in k-space and the calculation of the data error in step iv) may be performed in k-space. The data processing server 22 repeats ii) to iv) to improve the estimate of the spatial map of the earlier iteration and the estimate of the diagnostic image. The repetition is stopped when the calculated error of the latest iteration reaches within a tolerance range and wherein the estimate of the diagnostic image from the latest iteration becomes the diagnostic image of the sample. The tolerance range may be defined with regards to the maximum change in the estimate of the $B_0$ field map. For example, the iterations could be terminated and the final diagnostic image outputted when this change in value is less than 1 Hz.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

As shown in FIG. 3, the RF system 26 may be connected to the whole body RF coil 34, or as shown in FIG. 3, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Figure 4:
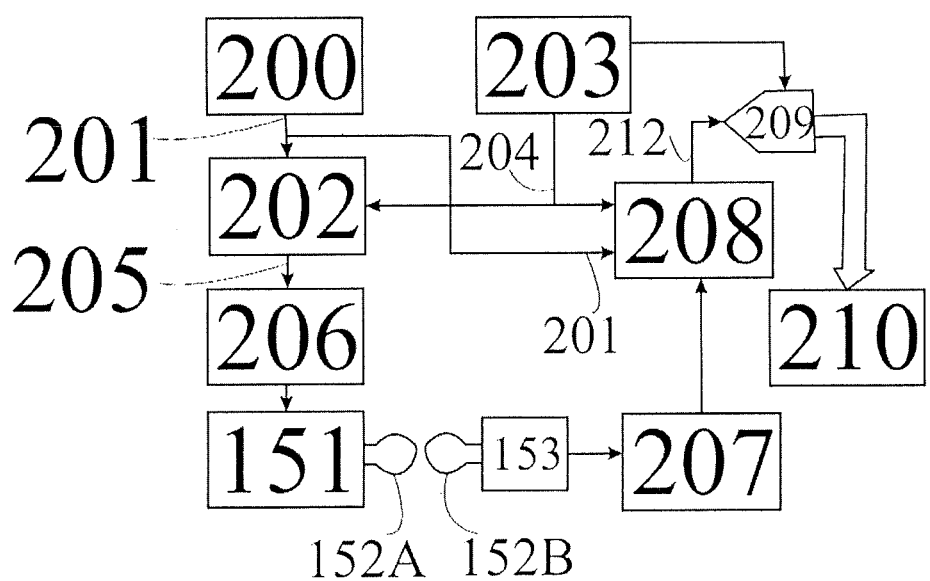
FIG. 4 shows components of a transmitter that produces a prescribed RF excitation field, the transmitter being part of the MRI system of FIG. 2.

Referring to FIG. 4, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A. Referring still to FIG. 3, the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 is produced by a reference frequency generator 203.

It has been found that a MRI system that employs the method of FIG. 1 is able to reconstruct images of diagnostic quality of samples in a magnetic field of around 5 to 200 ppm in homogeneity. As an example, FIG. 5A shows an image, before correction, of a grid phantom acquired at 1.5 Tesla of a magnetic field at 160 ppm homogeneity. In FIG. 5A, distortion can be seen in the image. FIG. 5B shows the same image of FIG. 5A, after undergoing correction in accordance with the method of FIG. 1. Five iterations of steps iii) to v) of the method of FIG. 1 were performed. It can be seem that the geometric distortion is corrected in FIG. 5B.

The method of FIG. 1 is also able to improve images taken in magnetic fields that are generally homogeneous. Image quality improvement is required even when a generally homogeneous magnetic field is used because the sample perturbs the magnetic field in which it is placed, thereby introducing a degree of inhomogeneity into the magnetic field. As an example, FIG. 6A shows an image, before correction, of a grid phantom acquired at 1.5 Tesla at 30 ppm homogeneity. In FIG. 6A, distortion can be seen in the image, although it is not as severe as that shown in FIG. 5A. FIG. 6B shows the same image of FIG. 6A, after undergoing correction in accordance with the method of FIG. 1. Five iterations of steps iii) to v) of the method of FIG. 1 were performed. It can be seem that the geometric distortion is corrected in FIG. 6B.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

REFERENCES

[1]. K. Sekihara, S. Matsui, and H. Kohno, "NMR imaging for magnets with large nonuniformities," *IEEE Trans. Med. Imag.*, vol. MI-4, no. 4, pp. 193-199, December 1985.

[2] E. Yudilevich and H. Stark, "Spiral sampling in magnetic resonance imaging—The effect of inhomogeneities," *IEEE Trans. Med. Imag.*, vol. MI-6, no. 4, December 1987.

[3] D. C. Noll, C. H. Meyer, J. M. Pauly, D. G. Nishimura, and A. Macovski, "A homogeneity correction method for magnetic resonance imaging with time-varying gradients," *IEEE Trans. Med. Imag.*, vol. 10, no. 4, pp. 629-637, December 1991.

[4] H. Chang and J. M. Fitzpatrick, "A technique for accurate magnetic resonance imaging in the presence of field inhomogeneities," *IEEE Trans. Med. Imag.*, vol. 11, no. 3, pp. 319-329, September 1992.

[5] T. S. Sumanaweera, G. H. Glover, T. O. Binford, and J. R. Adler, "MR susceptibility misregistration correction," *IEEE Trans. Med. Imag.*, vol. 12, no. 2, pp. 251-259, June 1993.

[6] P. Jezzard and R. S. Balaban, "Correction for geometric distortion in echo planar images from B field variations," *Mag. Res. Med.*, vol. 34, no. 1, pp. 65-73, July 1995.

[7] Y. M. Kadah and X. Hu, "Simulated phase evolution rewinding (SPHERE): A technique for reducing B inhomogeneity effects in MR images," *Mag. Res. Med.*, vol. 38, pp. 615-627, 1997.

[8] "Algebraic reconstruction for magnetic resonance imaging under B inhomogeneity," *IEEE Trans. Med. Imag.*, vol. 17, no. 3, pp. 362-370, June 1998.

[9] T. B. Harshbarger and D. B. Twieg, "Iterative reconstruction of singleshot spiral MRI with off-resonance," *IEEE Trans. Med. Imag.*, vol. 18, no. 3, pp. 196-205, March 1999.

[10] H. Schomberg, "Off-resonance correction of MR images," *IEEE Trans. Med. Imag.*, vol. 18, no. 6, pp. 481-495, Jun. 1999.

[11] J. Kybic, P. Thevenaz, A. Nirkko, and M. Unser, "Unwarping of unidirectionally distorted EPI images," *IEEE Trans. Med. Imag.*, vol. 19, no. 2, pp. 80-93, February 2000.

[12] P. Munger, G. R. Crelier, T. M. Peters, and G. B. Pike, "An inverse problem approach to the correction of distortion in EPI images," *IEEE Trans. Med. Imag.*, vol. 19, no. 7, pp. 681-689, July 2000.

[13] K. S. Nayak and D. G. Nishimura, "Automatic field map generation and off-resonance correction for projection reconstruction imaging," *Mag. Res. Med., vol.* 43, no. 1, pp. 151-154, January 2000.

[14] K. S. Nayak, C.-M. Tsai, C. H. Meyer, and D. G. Nishimura, "Efficient off-resonance correction for spiral imaging," *Mag. Res. Med.*, vol. 45, no. 3, pp. 521-524, March 2001.

[15] J. A. Akel, M. Rosenblitt, and P. Irarrazaval, "Off-resonance correction using an estimated linear time map," *Mag. Res. Imag.*, vol. 20, no. 2, pp. 189-198, February 2002.

[16] R. Deichmann, O. Josephs, C. Hutton, D. R. Corfield, and R. Turner, "Compensation of susceptibility-induced BOLD sensitivity losses in echo-planar fMRI imaging," *NeuroImag.*, vol. 15, no. 1, pp. 120-135, January 2002.

[17] H. Moriguchi, B. M. Dale, J. S. Lewin, and J. L. Duerk, "Block regional off-resonance correction (BRORC): A fast and effective deblurring method for spiral imaging," *Mag. Res. Med.*, vol. 50, no. 3, pp. 643-648, September 2003.

[18] B. P. Sutton, D. C. Noll, and J. A. Fessler, "Fast, iterative image reconstruction for MRI in the presence of field inhomogeneities," *IEEE Trans. Med. Imag.*, vol. 22, no. 2, pp. 178-188, February 2003.

[19] Pruessmann KP1, Weiger M, Scheidegger M B, Boesiger P. "SENSE: sensitivity encoding for fast MRI," *Magn Reson Med.* 1999 November; 42(5):952-62

[20] Jezzard, P. and Balaban, R. S. (1995), Correction for geometric distortion in echo planar images from B0 field variations. *Magn Reson Med,* 34: 65-73. doi: 10.1002/mrm.

The invention claimed is:
1. A method of constructing a diagnostic image of a sample from MRI data acquired while subjecting the sample to an inhomogeneous polarizing magnetic field, the method comprising the steps of:
   i) deriving an estimate of the spatial map of the inhomogeneous polarizing magnetic field;
   ii) acquiring the MRI data;

iii) processing the estimate of the spatial map with the acquired MRI data to obtain an estimate of the diagnostic image;

iv) calculating an acquired data error in response to the estimates of the spatial map and the diagnostic image;

v) updating the estimate of the spatial map in response to the calculated error; and repeating the steps iii) to v) to improve the estimate of the spatial map of the earlier iteration and the estimate of the diagnostic image, wherein the repetition is stopped when the calculated error of the latest iteration reaches within a tolerance range and wherein the estimate of the diagnostic image from the latest iteration becomes the diagnostic image of the sample.

2. The method of claim 1, wherein step iii) is performed with an algorithm which comprises the use of a mathematic approximation function.

3. The method of claim 2, wherein the mathematic approximation function is based on a Taylor series.

4. The method of claim 1, wherein the tolerance range is less than 1 Hz.

5. The method of claim 1, wherein the estimate of the spatial map of step i) is derived with the sample absent from the inhomogeneous polarizing magnetic field.

6. The method of claim 1, wherein the spatial map of the inhomogeneous polarizing magnetic field, used for step i) is obtained from a magnetic field detector measurement of the inhomogeneous polarizing magnetic field to which the sample is subjected or an imaging process that employs an imaging phantom.

7. The method of claim 1, wherein step iv) uses data obtained from all spatial locations of both the estimate of the spatial map and the MRI data obtained from the sample.

8. The method of claim 1, wherein step iv) comprises comparing data from the estimate of the diagnostic image obtained from the estimate of the spatial map and the MRI data measured from the sample, wherein a voxel of the estimate of the diagnostic image is created from data used in the comparison.

9. The method of claim 1, wherein the MRI data measured from the sample is obtained from exciting the sample using RF pulses.

10. The method of claim 1, wherein the MRI data measured from the sample is measured at a sampling rate determined by the bandwidth of the inhomogeneous polarizing magnetic field.

11. The method of claim 1, wherein step ii) comprises acquiring the MRI data at different time intervals.

12. An MRI data processing server for constructing a diagnostic image of a sample from MRI data acquired while subjecting the sample to an inhomogeneous polarizing magnetic field, the data processing server comprising:

at least one processor; and at least one memory including computer program code;

the at least one memory and the computer program code configured to, with the at least one processor, cause the server at least to:

i) derive an estimate of the spatial map of the inhomogeneous polarizing magnetic field;

ii) process the estimate of the spatial map with the acquired MRI data to obtain an estimate of the diagnostic image;

iii) calculate an acquired data error in response to the estimates of the spatial map and the diagnostic image;

iv) update the estimate of the spatial map in response to the calculated error; and repeat ii) to iv) to improve the estimate of the spatial map of the earlier iteration and the estimate of the diagnostic image, wherein the repetition is stopped when the calculated error of the latest iteration reaches within a tolerance range and wherein the estimate of the diagnostic image from the latest iteration becomes the diagnostic image of the sample.

* * * * *